(12) United States Patent
Kuo et al.

(10) Patent No.: US 12,396,100 B2
(45) Date of Patent: Aug. 19, 2025

(54) CIRCUIT BOARD STRUCTURE AND MANUFACTURING METHOD THEREOF

(71) Applicant: UNIMICRON TECHNOLOGY CORP., Taoyuan (TW)

(72) Inventors: Chun Hung Kuo, Taoyuan (TW);
Kuo-Ching Chen, Taoyuan (TW);
Yu-Cheng Huang, Taoyuan (TW);
Yu-Hua Chen, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 175 days.

(21) Appl. No.: 18/205,240

(22) Filed: Jun. 2, 2023

(65) Prior Publication Data
US 2024/0381533 A1 Nov. 14, 2024

(30) Foreign Application Priority Data

May 10, 2023 (TW) ................................ 112117285

(51) Int. Cl.
*H05K 1/14* (2006.01)
*H05K 1/16* (2006.01)
*H05K 3/00* (2006.01)

(52) U.S. Cl.
CPC ............. *H05K 1/142* (2013.01); *H05K 1/141* (2013.01); *H05K 1/165* (2013.01); *H05K 3/0014* (2013.01); *H05K 2201/086* (2013.01)

(58) Field of Classification Search
CPC ...... H05K 1/144; H05K 1/0298; H05K 1/115; H05K 3/0014; H05K 1/141; H05K 1/142; H05K 2201/086; H05K 2201/09845; H05K 2201/10522; H05K 2201/10977; H05K 1/165; H05K 1/117; H05K 1/184;
(Continued)

(56) References Cited

U.S. PATENT DOCUMENTS

| | | | |
|---|---|---|---|
| 6,023,202 A * | 2/2000 | Hill | H04L 25/0266 333/24 C |
| 7,201,582 B1 * | 4/2007 | Sternberg | H01P 1/047 439/65 |
| 8,325,002 B2 | 12/2012 | Lim et al. | |

(Continued)

FOREIGN PATENT DOCUMENTS

| | | |
|---|---|---|
| CN | 106010124 A | 10/2016 |
| TW | 201142879 A | 12/2011 |
| TW | I710092 B | 11/2020 |

*Primary Examiner* — Steven T Sawyer
(74) *Attorney, Agent, or Firm* — R. Burns Israelsen

(57) ABSTRACT

A circuit board structure including a first circuit board, a second circuit board, a conductive coil and a first molding compound and a manufacturing method thereof. The first circuit board has a first side surface. The second circuit board has a second side surface facing the first side surface and being spaced apart from the first side surface. The conductive coil is in a spiral shape and includes a first coil pattern and a second coil pattern. The first coil pattern is disposed in the first circuit board. The second coil pattern is disposed in the second circuit board. The first coil pattern is electrically connected to the second coil pattern. The first molding compound is magnetic and filled in a gap located between the first side surface and the second side surface. The conductive coil surrounds at least a part of the first molding compound.

17 Claims, 14 Drawing Sheets

(58) Field of Classification Search
CPC ... H05K 2201/0919; H05K 2201/1034; H05K 1/145; H01F 2027/2814
See application file for complete search history.

(56) References Cited

U.S. PATENT DOCUMENTS

| | | | |
|---|---|---|---|
| 9,781,834 B1* | 10/2017 | Sturcken | H05K 1/0233 |
| 10,278,279 B1* | 4/2019 | Sultenfuss | H01F 27/363 |
| 10,892,230 B2 | 1/2021 | Lu et al. | |
| 11,158,444 B2 | 10/2021 | Marin et al. | |
| 11,387,198 B2 | 7/2022 | Gomes et al. | |
| 2002/0075116 A1* | 6/2002 | Peels | H01F 27/2804 |
| | | | 336/200 |
| 2007/0080441 A1* | 4/2007 | Kirkman | H01L 25/0657 |
| | | | 257/E23.079 |
| 2012/0287591 A1* | 11/2012 | Ishikawa | H01R 12/613 |
| | | | 361/803 |
| 2017/0005077 A1* | 1/2017 | Kim | H05K 1/0274 |
| 2019/0385959 A1* | 12/2019 | Xu | H01L 23/645 |
| 2022/0037074 A1* | 2/2022 | Tashiro | H02M 3/33576 |
| 2024/0097303 A1* | 3/2024 | Liu | H01P 1/36 |

* cited by examiner

CIRCUIT BOARD STRUCTURE AND MANUFACTURING METHOD THEREOF

CROSS-REFERENCE TO RELATED APPLICATIONS

This non-provisional application claims priority under 35 U.S.C. § 119(a) on Patent Application No(s). 112117285 filed in Taiwan, R.O.C. on May 10, 2023, the entire contents of which are hereby incorporated by reference.

TECHNICAL FIELD

The disclosure relates to a circuit board structure and a manufacturing method thereof, more particularly to a circuit board structure including a conductive coil and a first molding compound and a manufacturing method thereof.

BACKGROUND

An inductor, a passive component in electronics, has multiple functions of, for example, filtering noise, suppressing momentary current, preventing interference caused by electromagnetic wave, shielding electromagnetic radiation, reducing electromagnetic interference and converting power. Thus, there is usually at least one inductor disposed in a circuit board.

In general, in order to configure an inductor, an entire of a conductive coil is formed in a single circuit board. However, the entire of the conductive coil occupies significant amount of space in the circuit board, which is unfavorable for the space utilization and the miniaturization of the circuit board.

SUMMARY

The disclosure provides a circuit board structure and a manufacturing method thereof to improve the space utilization of the circuit board and facilitate the miniaturization of the circuit board.

One embodiment of this disclosure provides a circuit board structure including a first circuit board, a second circuit board, a conductive coil and a first molding compound. The first circuit board has a first side surface. The second circuit board has a second side surface facing the first side surface and being spaced apart from the first side surface. The conductive coil is in a spiral shape and includes a first coil pattern and a second coil pattern. The first coil pattern is disposed in the first circuit board. The second coil pattern is disposed in the second circuit board. The first coil pattern is electrically connected to the second coil pattern. The first molding compound is magnetic and filled in a gap located between the first side surface and the second side surface. The conductive coil surrounds at least a part of the first molding compound.

In an embodiment of the disclosure, the circuit board structure further includes a third circuit board. The first circuit board and the second circuit board are disposed on the third circuit board.

In an embodiment of the disclosure, the conductive coil further comprises a third coil pattern disposed in the third circuit board. The first coil pattern is electrically connected to the second coil pattern via the third coil pattern.

In an embodiment of the disclosure, the circuit board structure further includes a first die and a second die. The first die is disposed on the first circuit board, and the second die is disposed on the second circuit board.

In an embodiment of the disclosure, the circuit board structure further includes a second molding compound. The second molding compound is filled in a gap located on a side of the third circuit board located closest to the first circuit board and the second circuit board.

In an embodiment of the disclosure, the circuit board structure further includes a fourth circuit board disposed on the first circuit board and the second circuit board.

In an embodiment of the disclosure, the conductive coil further includes a third coil pattern and a fourth coil pattern. The third coil pattern is disposed in the third circuit board. The fourth coil pattern is disposed in the fourth circuit board. The first coil pattern is electrically connected to the second coil pattern via the third coil pattern and the fourth coil pattern.

In an embodiment of the disclosure, the circuit board structure further includes a second molding compound and a third molding compound. The second molding compound is filled in a gap located on a side of the third circuit board located closest to the first circuit board and the second circuit board. The third molding compound is filled in a gap located on a side of the fourth circuit board located closest to the first circuit board and the second circuit board.

In an embodiment of the disclosure, the second circuit board further has a cavity. The second side surface faces the cavity. The first circuit board is located in the cavity.

In an embodiment of the disclosure, the circuit board structure further includes a second molding compound. The first circuit board further has a bottom surface. The bottom surface is located adjacent to the first side surface. The second circuit board further has a lower surface. The lower surface and the second side surface form the cavity. The second molding compound is filled in a gap located between the bottom surface of the first circuit board and the lower surface of the second circuit board.

A manufacture method of a circuit board structure according to another embodiment of the disclosure includes the following steps: forming a first coil pattern of a conductive coil in a first circuit board, forming a second coil pattern of the conductive coil in a second circuit board, electrically connecting the first coil pattern to the second coil pattern, and filling a first molding compound in a gap located between a first side surface of the first circuit board and a second side surface of the second circuit board. The first molding compound is magnetic. The conductive coil surrounds at least a part of the first molding compound.

In an embodiment of the disclosure, the manufacture method of the circuit board structure further includes disposing the first circuit board and the second circuit board on a third circuit board.

In an embodiment of the disclosure, the manufacture method of the circuit board structure further includes forming a third coil pattern of the conductive coil in the third circuit board. Electrically connecting the first coil pattern to the second coil pattern includes electrically connecting the first coil pattern to the second coil pattern via the third coil pattern.

In an embodiment of the disclosure, the manufacture method of the circuit board structure further includes disposing a fourth circuit board on the first circuit board and the second circuit board.

In an embodiment of the disclosure, the manufacture method of the circuit board structure further includes forming a third coil pattern of the conductive coil in the third circuit board, and forming a fourth coil pattern of the conductive coil in the fourth circuit board. Electrically connecting the first coil pattern to the second coil pattern includes electrically connecting the first coil pattern to the second coil pattern via the third coil pattern and the fourth coil pattern.

According to the circuit board structure and the manufacture method thereof disclosed by above embodiments, the conductive coil is in a spiral shape and includes the first coil pattern disposed in the first circuit board and the second coil pattern disposed in the second circuit board. That is, the present disclosure respectively forms multiple coil patterns in multiple circuit boards to configure the conductive coil, thereby preventing the conductive coil from occupying significant amount of space in a single circuit board. Accordingly, the space utilization of each of the first circuit board and the second circuit board is improved, and the miniaturization of each of the first circuit board and the second circuit board is facilitated.

In addition, the magnetic first molding compound is filled in the gap between the first side surface and the second side surface, and the conductive coil surrounds at least a part of the first molding compound. Therefore, the first molding compound can enhance the inductance effect generated by the conductive coil without occupying the space in the first circuit board or the second circuit board. That is, the first molding compound enhances the inductance effect while improving the space utilization of each of the first circuit board and the second circuit board.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
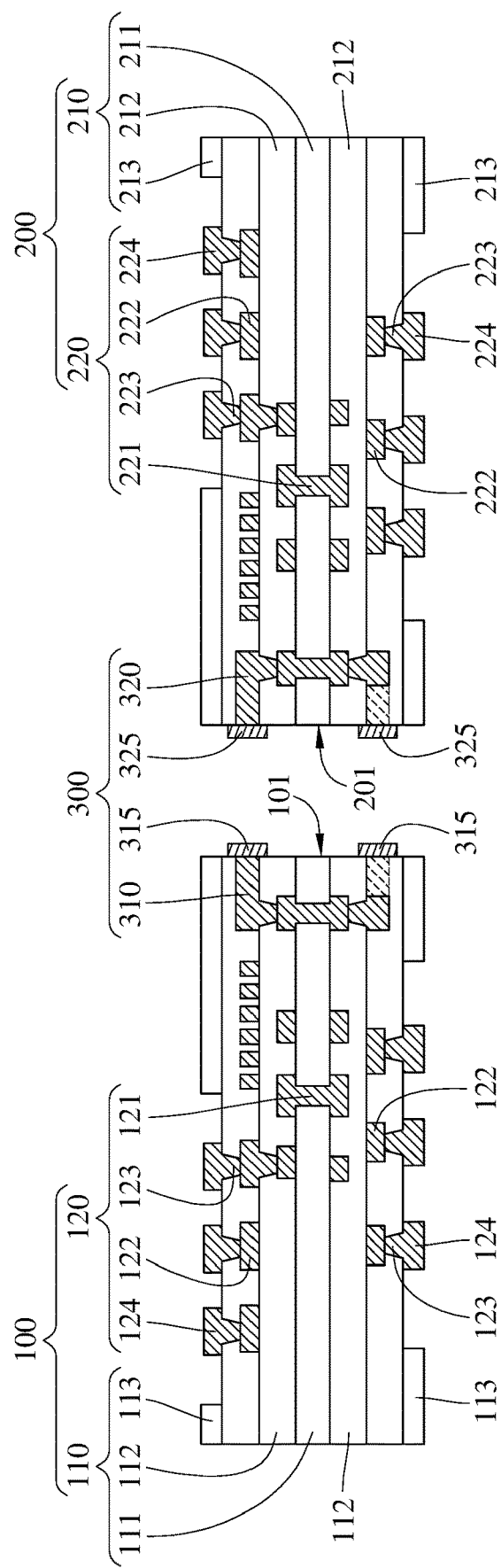
FIGS. 1 to 3 are side cross-sectional views showing a manufacture method of a circuit board structure according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
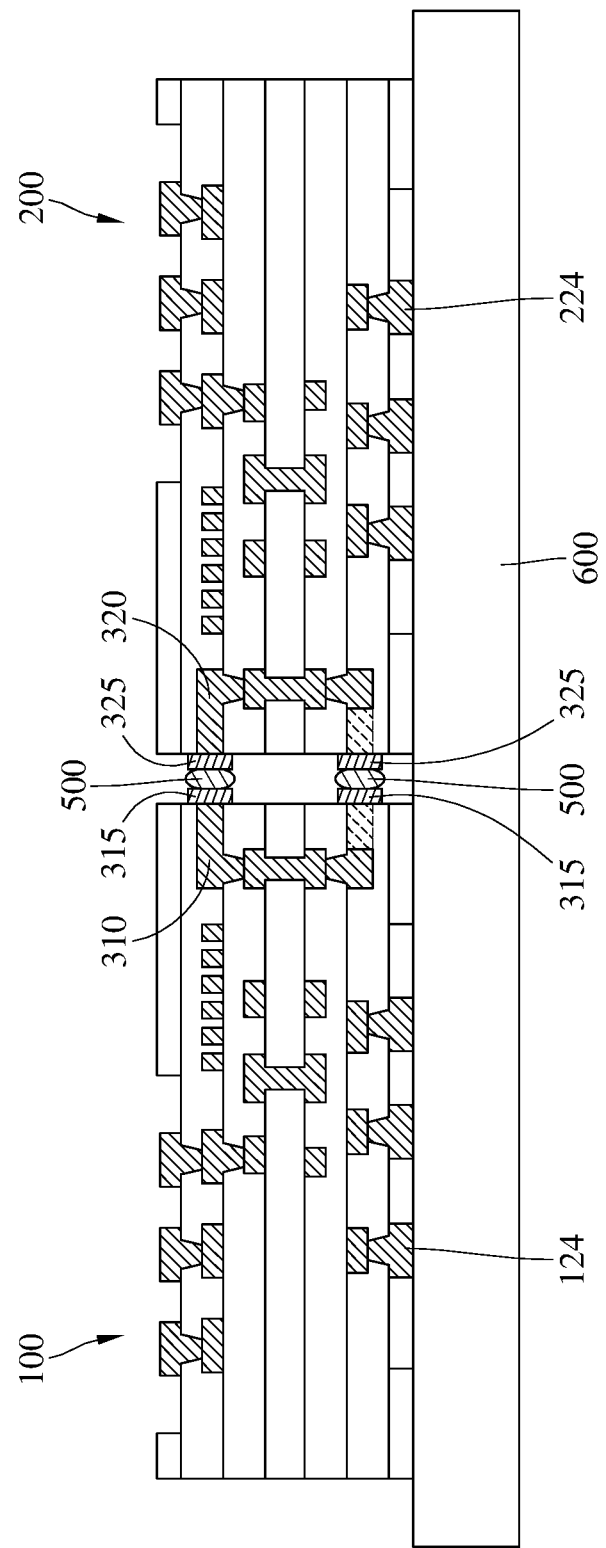
Figure 3:
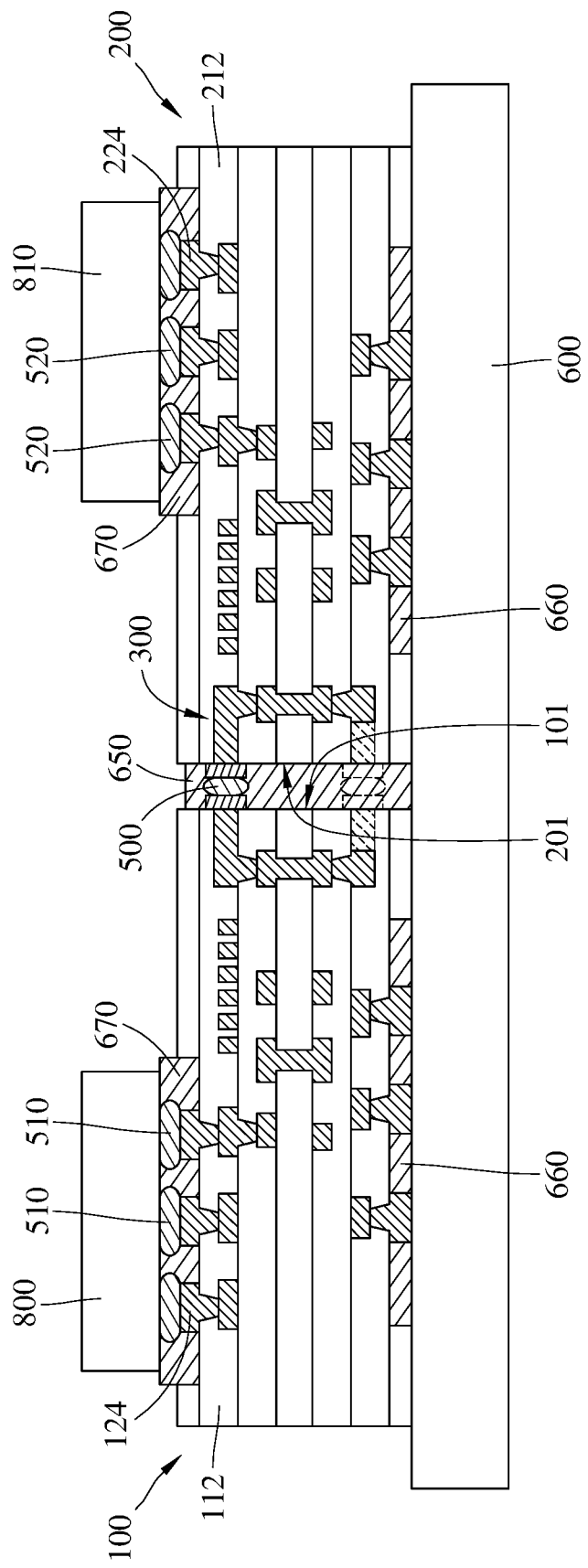

Please refer to FIGS. 1 to 3. FIGS. 1 to 3 are side cross-sectional views showing a manufacture method of a circuit board structure 10 according to a first embodiment of the disclosure. The manufacture method of the circuit board structure 10 according to this embodiment may include the following steps.

Please refer to FIG. 1, a first coil pattern 310 of a conductive coil 300 is formed in a first circuit board 100. The first circuit board 100 includes an insulating part 110 and a conductive part 120. The insulating part 110 is, for example, a multi-layered structure. The insulating part 110 includes a substrate 111, a plurality of dielectric layers 112 and two insulating material layers 113. The dielectric layers 112 are disposed on the substrate 111. The two insulating material layers 113 are disposed on the dielectric layers 112. The conductive part 120 is configured to transmit or receive one or more signals, and includes a conductive through hole 121, a plurality of wiring layers 122, a plurality of conductive blind vias 123 and a plurality of pads 124. The conductive through hole 121 penetrates through the substrate 111. The wiring layers 122 are disposed on the dielectric layers 112, respectively. The conductive blind vias 123 are located in the dielectric layers 112, respectively. The pads 124 are disposed on top and bottom sides of the dielectric layers 112 that are opposite to each other, respectively.

In this embodiment, the first coil pattern 310 includes a plurality of vertical portions and a plurality of horizontal portions. The vertical portions of the first coil pattern 310 are formed together with the conductive through hole 121 in the substrate 111, or formed together with the conductive blind vias 123 in each dielectric layer 112. The horizontal portions of the first coil pattern 310 are formed together with the wiring layers 122 on each dielectric layer 112.

In addition, a plurality of pads 315 are formed on the first coil pattern 310. The pads 315 are located on a first side surface 101 of the first circuit board 100.

In addition, a second coil pattern 320 of the conductive coil 300 is formed in a second circuit board 200. The second circuit board 200 includes an insulating part 210 and a conductive part 220. The insulating part 210 is, for example, a multi-layered structure. The insulating part 210 includes a substrate 211, a plurality of dielectric layers 212 and two insulating material layers 213. The dielectric layers 212 are disposed on the substrate 211. The two insulating material layers 213 are disposed on the dielectric layers 212. The conductive part 220 is configured to transmit or receive one or more signals, and includes a conductive through hole 221, a plurality of wiring layers 222, a plurality of conductive blind vias 223 and a plurality of pads 224. The conductive through hole 221 penetrates through the substrate 211. The wiring layer 222 are disposed on the dielectric layers 212, respectively. The conductive blind vias 223 are located in the dielectric layers 212, respectively. The pads 224 are disposed on top and bottom sides of the dielectric layers 212 that are opposite to each other, respectively.

In this embodiment, the second coil pattern 320 includes a plurality of vertical portions and a plurality of horizontal portions. The vertical portions of the second coil pattern 320 are formed together with the conductive through hole 221 in the substrate 211, or formed together with or the conductive blind vias 223 in each dielectric layer 212. The horizontal portions of the second coil pattern 320 are formed together with the wiring layers 222 on each dielectric layer 212.

Additionally, a plurality of pads 325 are formed on the second coil pattern 320. The pads 325 are located on a second side surface 201 of the second circuit board 200.

Note that the present disclosure is not limited by the orders of the steps shown in the drawings. For example, with respect to the steps shown in FIG. 1, in other embodiments, the first circuit board may be provided before the second circuit board is provided. Alternatively, the first coil pattern may be formed in the first circuit board before the second coil pattern is formed in the second circuit board. Alternatively, the pads may be formed on the first coil pattern before the pads are formed on the second coil pattern. The steps in other figures are not limited by their orders based on similar reasons, and thus the repeated descriptions are omitted.

Then, please refer to FIG. 2, the first coil pattern 310 is electrically connected to the second coil pattern 320. In detail, the pads 315 are electrically connected to the pad 325 via, for example, a plurality of solder balls 500, thereby electrically connecting the first coil pattern 310 to the second coil pattern 320.

In addition, the first circuit board 100 and the second circuit board 200 are disposed on a third circuit board 600. Also, the pads 124 and 224 are electrically connected to the third circuit board 600.

Then, please refer to FIG. 3, a first molding compound 650, which is magnetic, is filled in a gap located between the first side surface 101 of the first circuit board 100 and the second side surface 201 of the second circuit board 200. Also, a second molding compound 660 is filled in a gap located on a side of the third circuit board 600 that is located closest to the first circuit board 100 and the second circuit board 200. That is, the second molding compound 660 is filled in a gap located between the third circuit board 600 and the first circuit board 100 and a gap located between the third circuit board 600 and the second circuit board 200. In this embodiment, the first molding compound 650 is spaced apart from the second molding compound 660.

In addition, a first die 800 is disposed on the first circuit board 100, and a second die 810 is disposed on the second circuit board 200. The first die 800 is electrically connected to the pads 124 of the first circuit board 100 via, for example, solder balls 510. The second die 810 is electrically connected to the pads 224 of the second circuit board 200 via, for example, solder balls 520. Also, a die molding compound 670 is filled in, for example, a gap located between the first die 800 and the dielectric layers 112 of the first circuit board 100 and a gap located between the second die 810 and the dielectric layers 212 of the second circuit board 200. Manufacturing of the circuit board structure 10 is completed so far.

In addition, in this embodiment, the second molding compound 660 and the die molding compound 670 are, for example, magnetic, but the disclosure is not limited thereto. In other embodiments, the second molding compound and the die molding compound may not be magnetic. That is, the molding compounds except the first molding compound filled in the gap located between the first side surface of the first circuit board and the second side surface of the second circuit board, may not be magnetic.

Figure 4:
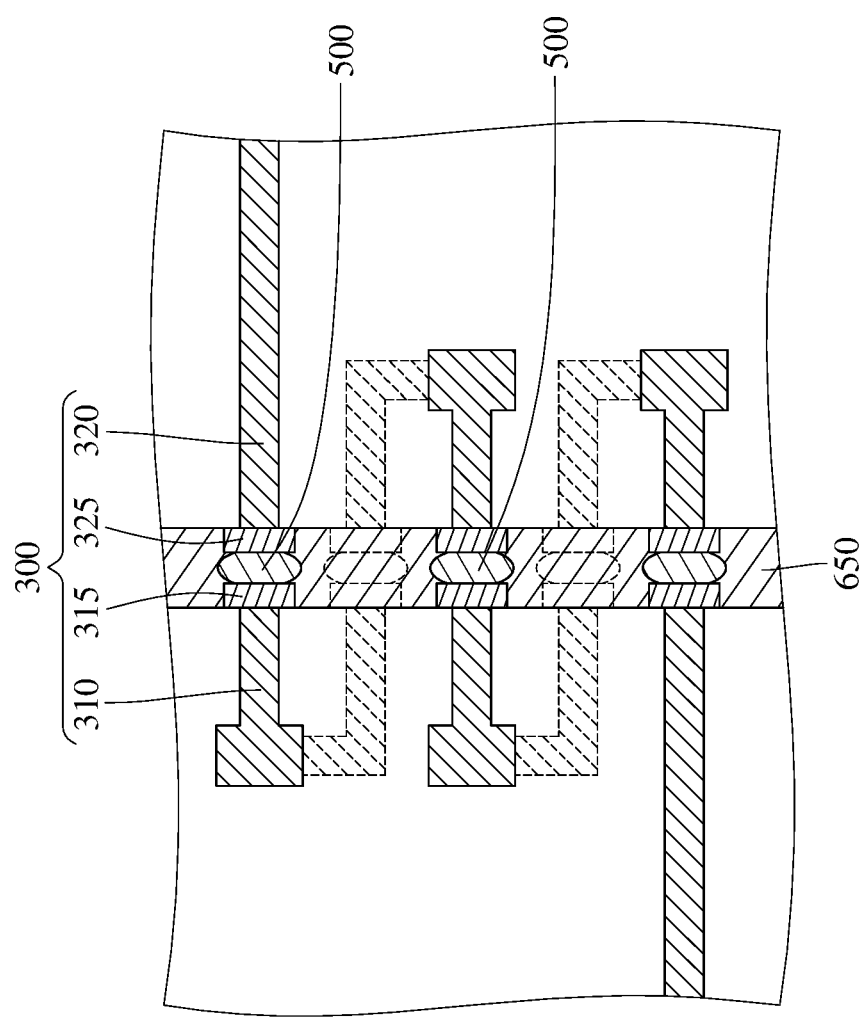
FIG. 4 is a top view of the circuit board structure according to the first embodiment of the disclosure.
Figure 5:
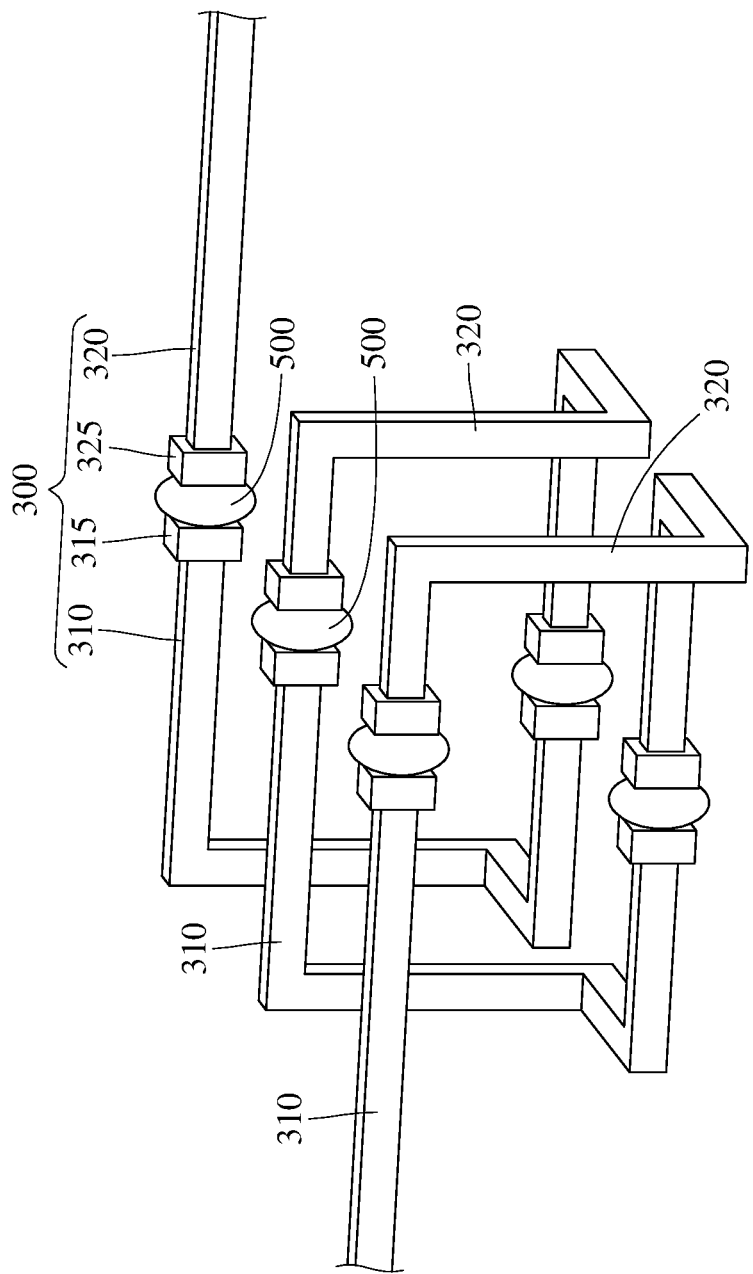
FIG. 5 is a perspective view of a conductive coil of the circuit board structure in FIG. 4.

Please refer to FIGS. 3 to 5. FIG. 4 is a top view of the circuit board structure 10 according to the first embodiment of the disclosure. FIG. 5 is a perspective view of the conductive coil 300 of the circuit board structure 10 in FIG. 4. In this embodiment, the conductive coil 300 is in a spiral shape, and surrounds at least a part of the first molding compound 650. In addition, in order to illustrate the spiral shape of the conductive coil 300, FIG. 5 shows the conductive coil 300 with simplified shape. In practical, the vertical portions of the first coil pattern 310 and the second coil pattern 320 in FIG. 5 may be similar to the conductive through holes 121 and 221 or the conductive blind vias 123 and 223 in shape. Also, the horizontal portions of the first coil pattern 310 and the second coil pattern 320 in FIG. 5 may be similar to the wiring layers 122 and 222 in shape. As shown in FIG. 5, the conductive coil 300 has, for example, three turns, but the disclosure is not limited thereto. In other embodiments, the conductive coil may merely have a single turn.

In addition, the disclosure is not limited by the arranging direction of the turns of the conductive coil 300. In other embodiments, as long as the conductive coil surrounds at least a part of the first molding compound, the turns of the conductive coil are allowed to be arranged along an arbitrary direction.

In this disclosure, the first circuit board 100 and the second circuit board 200 are respectively formed in the first coil pattern 310 and the second coil pattern 320 to configure the conductive coil 300. Thus, the space of the first circuit board 100 or the second circuit board 200 occupied by the conductive coil 300 is reduced. In this way, the space utilization of each of the first circuit board 100 and the second circuit board 200 is improved, and the miniaturization of each of the first circuit board 100 and the second circuit board 200 is facilitated.

In addition, the magnetic first molding compound 650 is filled in the gap located between the first side surface 101 and the second side surface 201, and the conductive coil 300 surrounds at least a part of the first molding compound 650. Therefore, the first molding compound 650 can enhance the inductance effect generated by the conductive coil 300 without occupying the space in the first circuit board 100 or the second circuit board 200. That is, the first molding compound 650 enhances the inductance effect while improving the space utilization of each of the first circuit board 100 and the second circuit board 200.

Other embodiments are described below for illustrative purposes. It is to be noted that the following embodiments use the reference numerals and a part of the contents of the above embodiments, the same reference numerals are used to denote the same or similar elements, and the description of the same technical contents is omitted. For the description of the omitted part, reference may be made to the above embodiments, and details are not described in the following embodiments.

Figure 6:
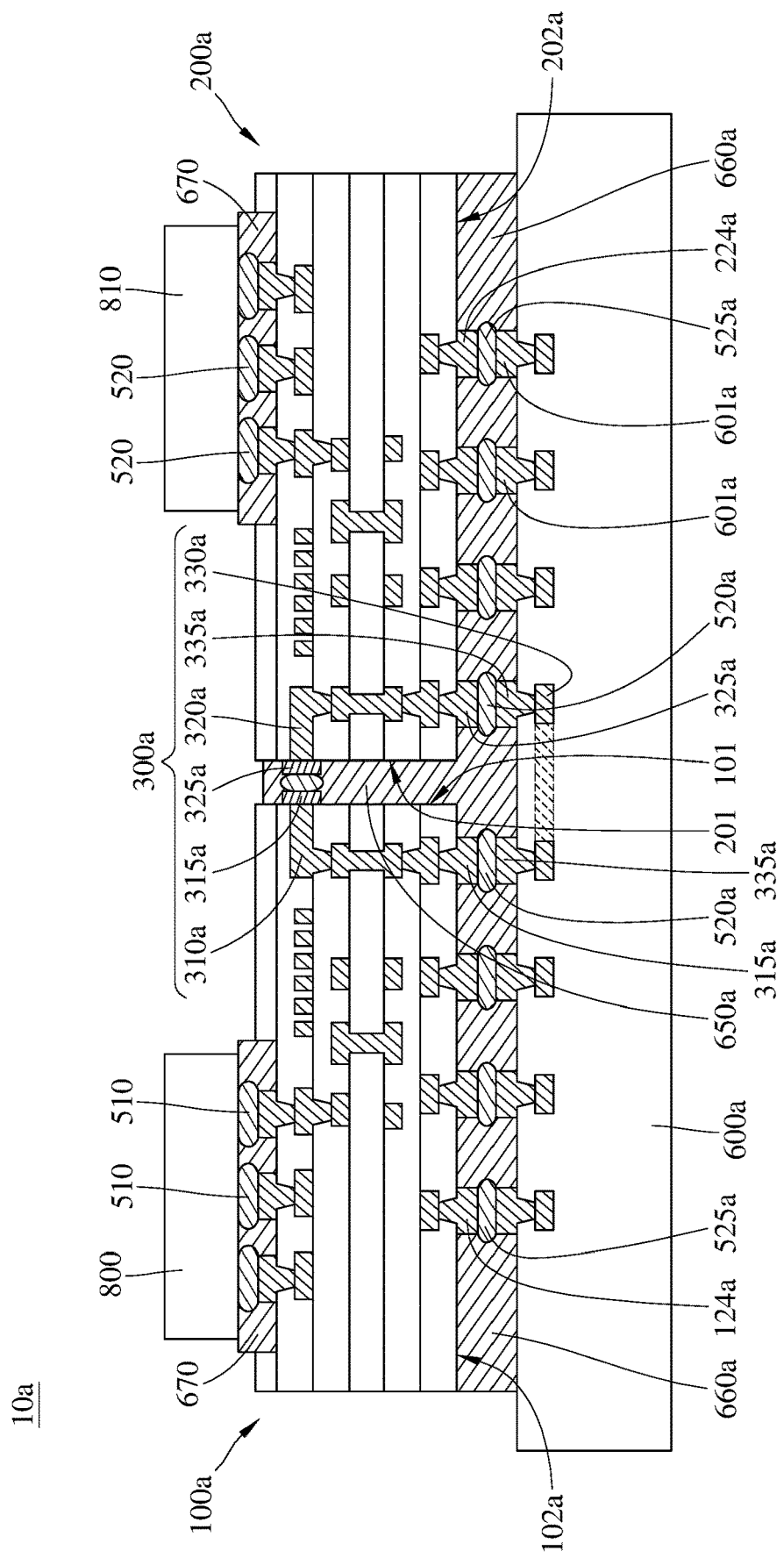
FIG. 6 is a side cross-sectional view of a circuit board structure according to a second embodiment of the disclosure.

The structure of the conductive coil may be adjusted according to the demand of the inductance effect for each circuit board. For example, please refer to FIG. 6. FIG. 6 is a side cross-sectional view of a circuit board structure 10a according to a second embodiment of the disclosure. The main difference between the circuit board structure 10a of this embodiment and the circuit board structure 10 of the first embodiment is the structure of a conductive coil 300a. Comparing to the first embodiment, a third circuit board 600a of this embodiment has higher demand for the inductance effect due to the demand of, for example, stabilizing voltage by removing magnetic fields. Thus, comparing to the first embodiment, the conductive coil 300a further includes a third coil pattern 330a and a plurality of pads 335a electrically connected to the third coil pattern 330a. The third coil pattern 330a is disposed in the third circuit board 600a.

The first coil pattern 310a is electrically connected to the second coil pattern 320a via the third coil pattern 330a. In detail, in this embodiment, the pads 315a are located on the first side surface 101 and a bottom surface 102a of the first circuit board 100a, respectively. The bottom surface 102a is located adjacent to the first side surface 101. Similarly, the pads 325a are located on the second side surface 201 and a bottom surface 202a of the second circuit board 200a, respectively. The bottom surface 202a is located adjacent to the second side surface 201. The pad 315a located on the first side surface 101 is electrically connected to the pad 325a located on the second side surface 201. The pad 315a located on the bottom surface 102a and the pad 325a located on the bottom surface 202a are electrically connected to the pads 335a via, for example, a plurality of solder balls 520a. Also, the pads 124a of the first circuit board 100a and the pads 224a of the second circuit board 200a are electrically connected to the pads 601a of the third circuit board 600a via, for example, a plurality of solder balls 525a. Additionally, in this embodiment, the first molding compound 650a is connected to the second molding compound 660a.

Figure 7:
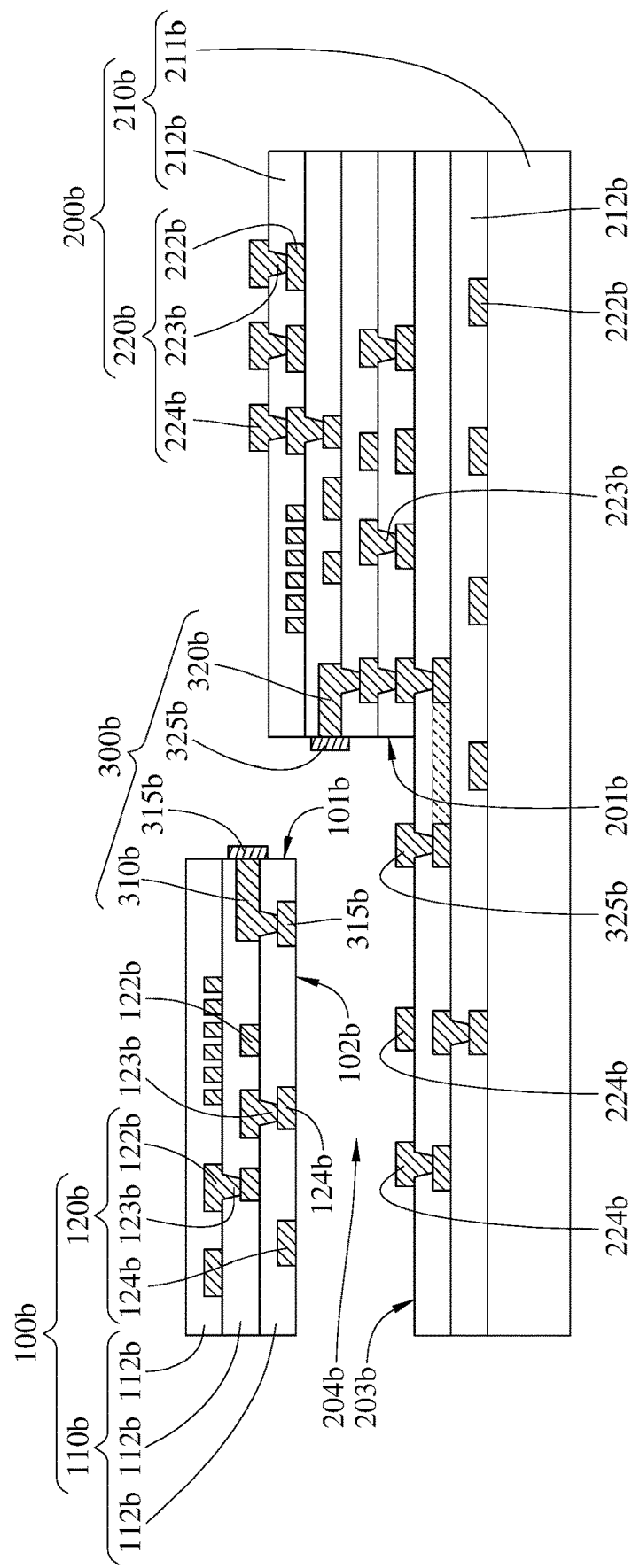
FIGS. 7 to 9 are side cross-sectional views showing a manufacture method of a circuit board structure according to a third embodiment of the disclosure.
Figure 8:
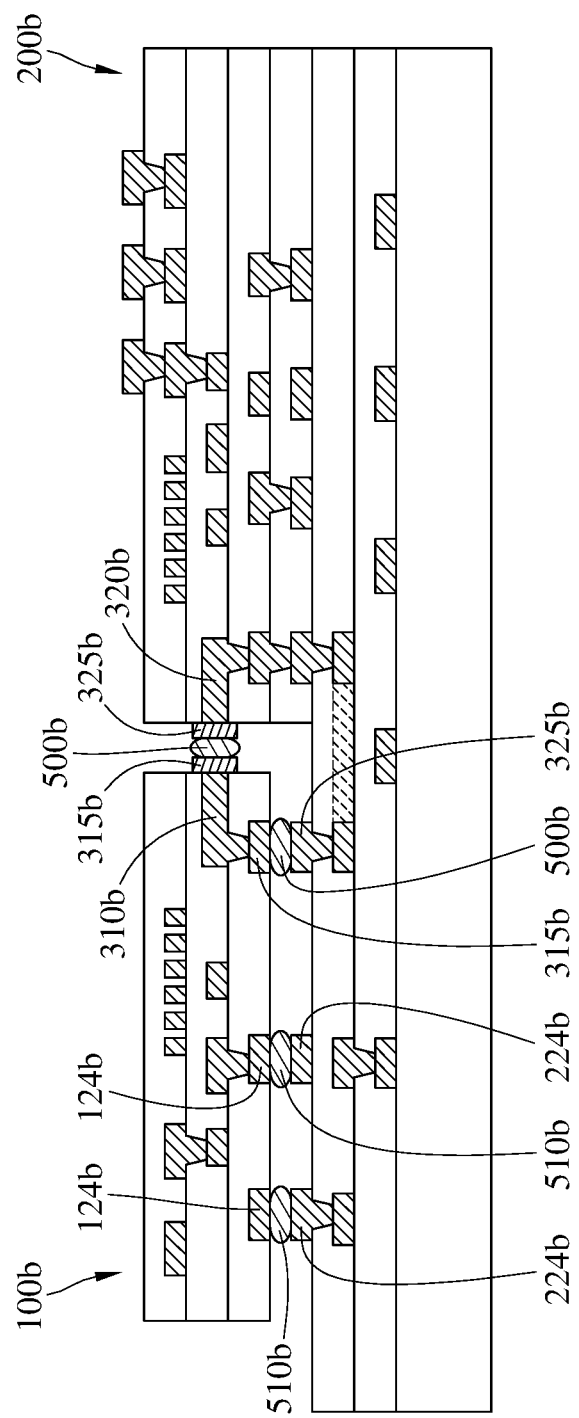
Figure 9:
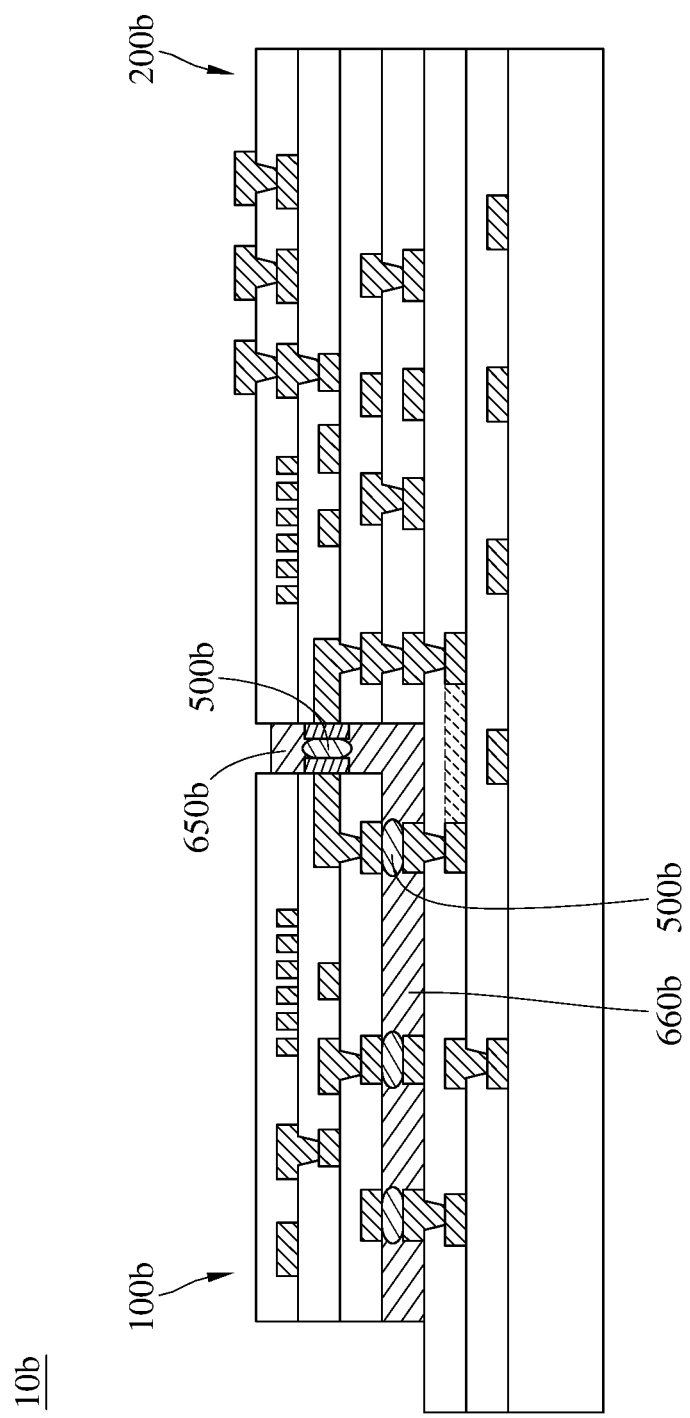

Note that the circuit board structure is not limited to include the third circuit board. The circuit board structure may merely include the first circuit board and the second circuit board without including the third circuit board. For example, please refer to FIGS. 7-9. FIGS. 7 to 9 are side cross-sectional views showing a manufacture method of a circuit board structure 10b according to a third embodiment of the disclosure. The manufacture method of the circuit board structure 10b may include following steps:

Please refer to FIG. 7, a first coil pattern 310b of a conductive coil 300b is formed in a first circuit board 100b. The first circuit board 100b includes an insulating part 110b and a conductive part 120b. The insulating part 110b is, for example, a multi-layered structure. The insulating part 110b includes a plurality of dielectric layers 112b. The conductive part 120b is configured to transmit or receive one or more signals, and includes a plurality of wiring layers 122b, a plurality of conductive blind vias 123b and a plurality of pads 124b. The wiring layers 122b are disposed on the dielectric layers 112b, respectively. The conductive blind vias 123b are located in the dielectric layers 112b, respectively. The pads 124b are located on a side of the dielectric layers 112b. The first coil pattern 310b is formed in the first circuit board 100b in a manner similar to the first coil pattern 310 in the first circuit board 100, and thus the repeated descriptions are omitted.

In addition, a plurality of pads 315b are formed on the first coil pattern 310b. The pads 315b are located on a first side surface 101b and a bottom surface 102b of the first circuit board 100b, respectively. The bottom surface 102b is located adjacent to the first side surface 101b.

Furthermore, a second coil pattern 320b of the conductive coil 300b is formed in a second circuit board 200b. The second circuit board 200b includes an insulating part 210b and a conductive part 220b. The insulating part 210b is, for example, a multi-layered structure. The insulating part 210b includes a substrate 211b and a plurality of dielectric layers 212b. The dielectric layers 212b are disposed on the substrate 211b. The conductive part 220b is configured to transmit or receive one or more signals, and includes a plurality of wiring layers 222b, a plurality of conductive blind vias 223b and a plurality of pads 224b. The wiring layers 222b are disposed on the dielectric layers 212b, respectively. The conductive blind vias 223b are located in the dielectric layers 212b, respectively. The pads 224b are located on a side of the dielectric layers 212b. The second coil pattern 320b is formed in the second circuit board 200b in a manner similar to the second coil pattern 320 in the second circuit board 200, and thus the repeated descriptions are omitted.

In addition, a plurality of pads 325b are formed on the second coil pattern 320b. The pads 325b are located on a second side surface 201b and a lower surface 203b of the second circuit board 200b, respectively.

In this embodiment, a size of the first circuit board 100b is, for example, smaller than a size of the second circuit board 200b. The second circuit board 200b has a cavity 204b. The cavity 204b is formed by the second side surface 201b and the lower surface 203b. The first circuit board 100b is located in the cavity 204b.

Please refer to FIG. 8, the first coil pattern 310b is electrically connected to the second coil pattern 320b. In detail, the pads 315b are electrically connected to the pads 325 via, for example, a plurality of solder balls 500b, thereby electrically connecting the first coil pattern 310b to the second coil pattern 320b. In addition, the pads 124b of the first circuit board 100b are electrically connected to the pads 224b of the second circuit board 200b via, for example, a plurality of solder balls 510b.

Please refer to FIG. 9, a first molding compound 650b that is magnetic is filled in a gap located between the first side surface 101b of the first circuit board 100b and the second side surface 201b of the second circuit board 200b. Also, a second molding compound 660b is filled in a gap located between the bottom surface 102b of the first circuit board 100b and the lower surface 203b of the second circuit board 200b. Manufacturing of the circuit board structure 10b is completed so far. In this embodiment, the first molding compound 650b is connected to the second molding compound 660b. Note that in this embodiment, the first molding compound 650b and the second molding compound 660b are sequentially filled, but the disclosure is not limited thereto. In other embodiments, in order to facilitate the manufacture process, the first molding compound may be simultaneously filled in both the gap located between the first side surface of the first circuit board and the second side surface of the second circuit board and the gap located between the bottom surface of the first circuit board and the recessed surface of the second circuit board, and the second molding compound may be omitted herein.

Figure 10:
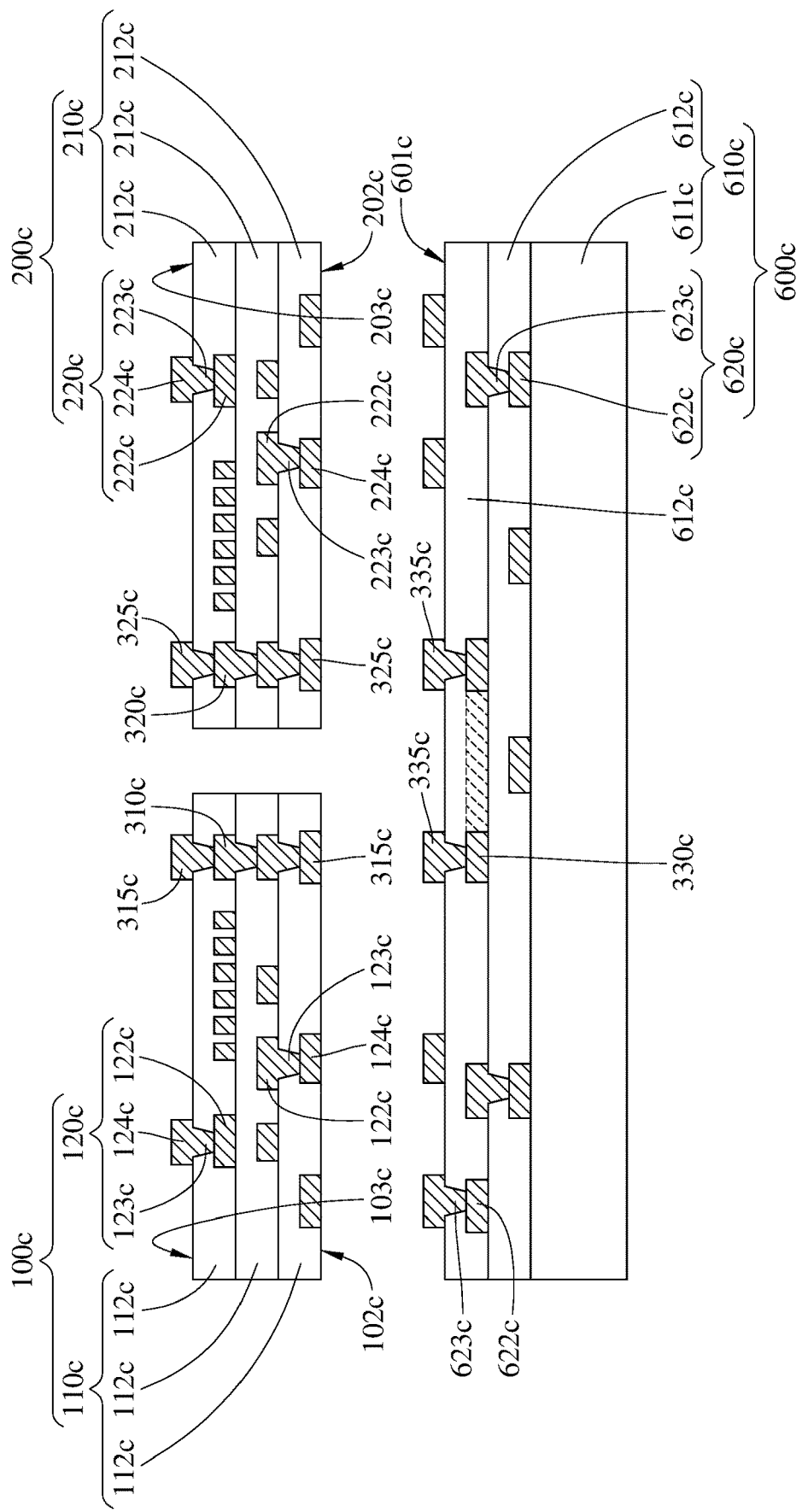
FIGS. 10 to 14 are side cross-sectional views showing a manufacture method of a circuit board structure according to a fourth embodiment of the disclosure.

The circuit board structure is not limited to include two or three circuit boards. The circuit board structure may include four or more circuit boards. For example, please refer to FIGS. 10 to 14. FIGS. 10 to 14 are side cross-sectional views showing a manufacture method of a circuit board structure 10c according to a fourth embodiment of the disclosure. The manufacture method of the circuit board structure 10c of this embodiment may include following steps:

Please refer to FIG. 10, a first coil pattern 310c is formed in a first circuit board 100c. The first circuit board 100c includes an insulating part 110c and a conductive part 120c. The insulating part 110c is, for example, a multi-layered structure. The insulating part 110c includes a plurality of dielectric layers 112c. The conductive part 120c is configured to transmit or receive one or more signals, and includes a plurality of wiring layers 122c, a plurality of conductive blind vias 123c and a plurality of pads 124c. The wiring layers 122c are disposed on the dielectric layers 112c, respectively. The conductive blind vias 123c are located in the dielectric layers 112c, respectively. The pads 124c are located on top and bottom sides of the dielectric layers 112c that are opposite to each other, respectively. The first coil pattern 310c is formed in the first circuit board 100c in a manner similar to the first coil pattern 310 in the first circuit board 100, and thus the repeated descriptions are omitted.

In addition, a plurality of pads 315c are formed on the first coil pattern 310c. The pads 315c are located on a bottom surface 102c and a top surface 103c of the first circuit board 100c, respectively. The bottom surface 102c faces away from the top surface 103c.

Additionally, a second coil pattern 320c is formed in a second circuit board 200c. The second circuit board 200c includes an insulating part 210c and a conductive part 220c. The insulating part 210c is, for example, a multi-layered structure. The insulating part 210c includes a plurality of dielectric layers 212c. The conductive part 220c is configured to transmit or receive one or more signals, and includes a plurality of wiring layers 222c, a plurality of conductive blind vias 223c and a plurality of pads 224c. The wiring layers 222c are disposed on the dielectric layers 212c, respectively. The conductive blind vias 223c are located in the dielectric layers 212c, respectively. The pads 224c are located on top and bottom sides of the dielectric layers 212c that are opposite to each other, respectively. The second coil pattern 320c is formed in the second circuit board 200c in a manner similar to the second coil pattern 320 in the second circuit board 200, and thus the repeated descriptions are omitted.

Furthermore, a plurality of pads 325c are formed on the second coil pattern 320c. The pads 325c are located on a bottom surface 202c and a top surface 203c of the second circuit board 200c, respectively. The bottom surface 202c faces away from the top surface 203c.

Moreover, a third coil pattern 330c is formed in a third circuit board 600c. The third circuit board 600c includes an insulating part 610c and a conductive part 620c. The insulating part 610c is, for example, a multi-layered structure. The insulating part 610c includes a substrate 611c and a plurality of dielectric layers 612c. The dielectric layers 612c are disposed on the substrate 611c. The conductive part 620c is configured to transmit or receive one or more signals, and includes a plurality of wiring layers 622c and a plurality of conductive blind vias 623c. The wiring layers 622c are disposed on the dielectric layers 612c, respectively. The conductive blind vias 623c are located in the dielectric layers 612c, respectively. The third coil pattern 330c is formed in the third circuit board 600c in a manner similar to the first coil pattern 310 in the first circuit board 100 or the second coil pattern 320 in the second circuit board 200, and thus the repeated descriptions are omitted.

Further, a plurality of pads 335c are formed on the third coil pattern 330c. The pads 335c are located on a top surface 601c of the third circuit board 600c. The top surface 601c faces the first circuit board 100c and the second circuit board 200c.

Figure 11:
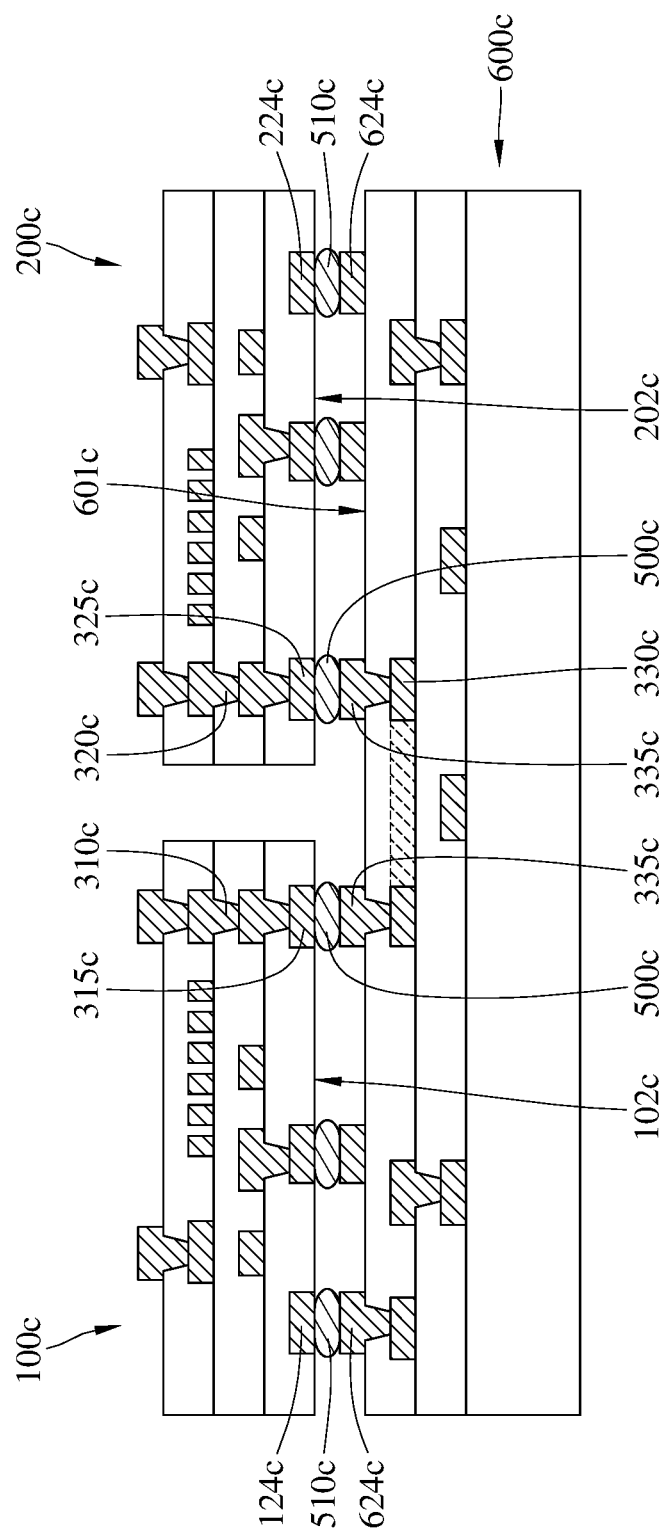

Please refer to FIG. 11, the first circuit board 100c and the second circuit board 200c are disposed on the third circuit board 600c. Also, the first coil pattern 310c and the second coil pattern 320c are electrically connected to the third coil pattern 330c. In detail, the pads 315c and 325c located on the bottom surfaces 102c and 202c are electrically connected to the pads 335c via, for example, a plurality of solder balls 500c, thereby electrically connecting the first coil pattern 310c and the second coil pattern 320c to the third coil pattern 330c. Also, the pads 124c of the first circuit board 100c and the pads 224c of the second circuit board 200c are electrically connected to the pads 624c of the third circuit board 600c via, for example, a plurality of solder balls 510c.

Figure 12:
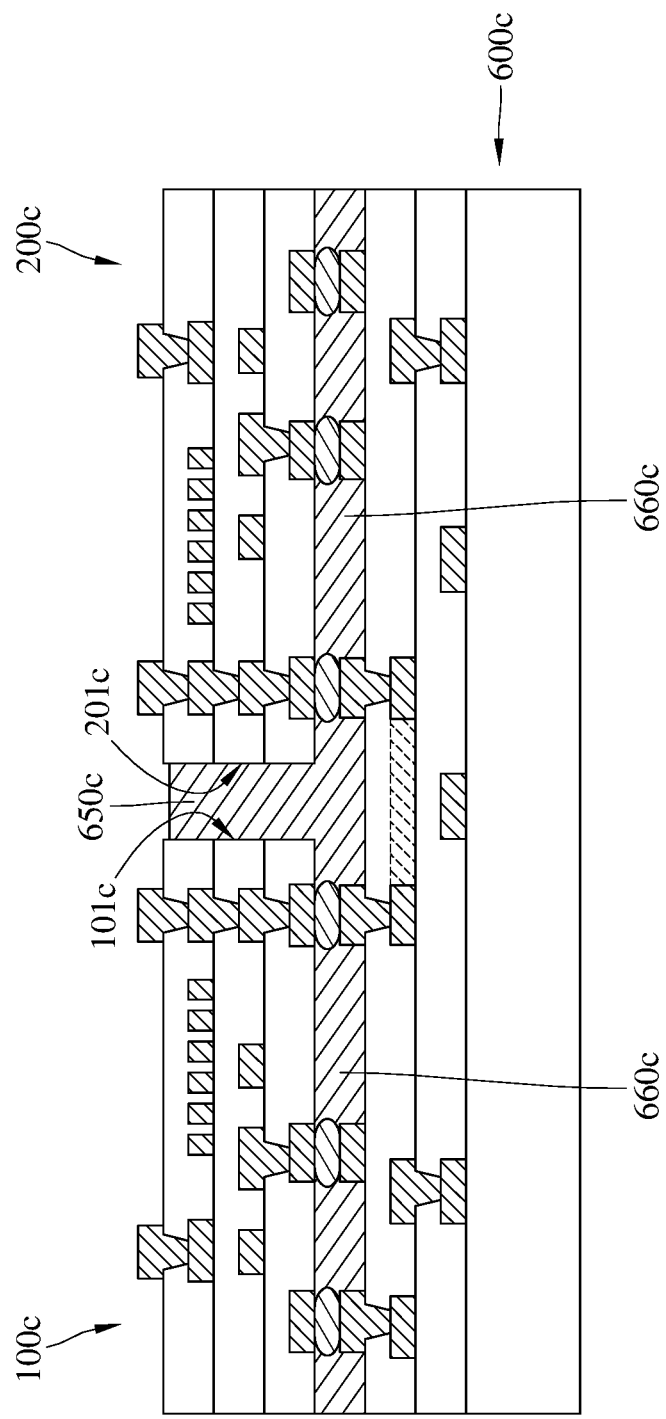

Please refer to FIG. 12, a first molding compound 650c, which is magnetic, is filled in a gap located between a first side surface 101c of the first circuit board 100c and a second side surface 201c of the second circuit board 200c. Also, a second molding compound 660c is filled in a gap located on a side of the third circuit board 600c that is located closest to the first circuit board 100c and the second circuit board 200c. That is, the second molding compound 660c is filled in a gap located between the first circuit board 100c and the third circuit board 600c, and a gap located between the second circuit board 200c and the third circuit board 600c. The first side surface 101c connects the bottom surface 102c and the top surface 103c. The second side surface 201c connects the bottom surface 202c and the top surface 203c.

Figure 13:
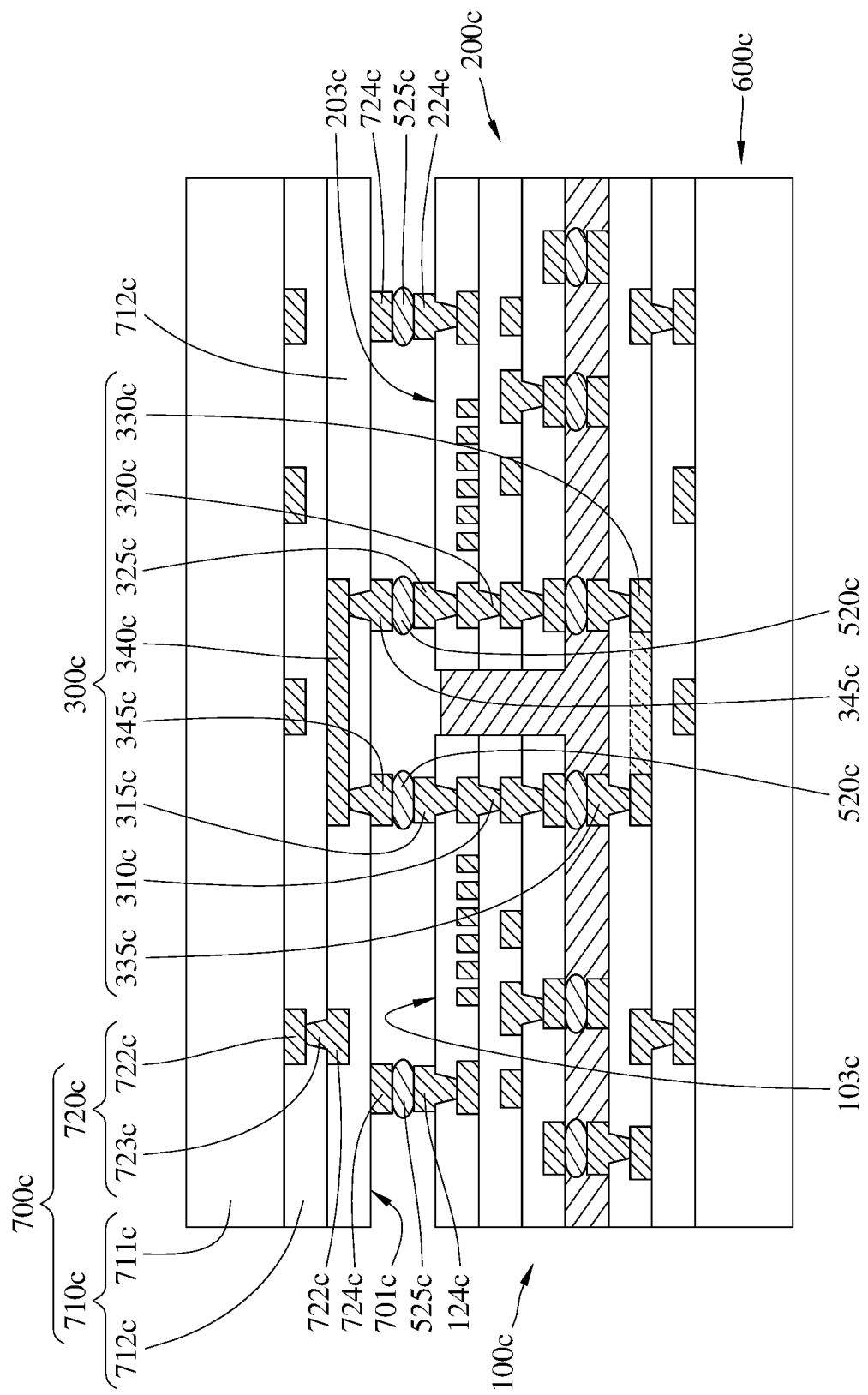

Please refer to FIG. 13, a fourth coil pattern 340c is formed in a fourth circuit board 700c. The fourth circuit board 700c is disposed on the first circuit board 100c and the second circuit board 200c. The fourth circuit board 700c includes an insulating part 710c and a conductive part 720c. The insulating part 710c is, for example, a multi-layered structure. The insulating part 710c includes a substrate 711c and a plurality of dielectric layers 712. The substrate 711c is disposed on the dielectric layers 712c. The conductive part 720c is configured to transmit or receive one or more signals, and includes a plurality of wiring layers 722c and a conductive blind via 723c. The wiring layers 722c are disposed on the dielectric layers 712c, respectively. The conductive blind via 723c is located in the dielectric layers 712c. The fourth coil pattern 340c is formed in the fourth circuit board 700c in a manner similar to the first coil pattern 310 in the first circuit board 100 or the second coil pattern 320 in the second circuit board 200, and thus the repeated descriptions are omitted.

In addition, a plurality of pads 345c are formed on the fourth coil pattern 340c. The pads 345c are located on a bottom surface 701c of the fourth circuit board 700c. The bottom surface 701c faces the first circuit board 100c and the second circuit board 200c.

Moreover, the first coil pattern 310c and the second coil pattern 320c are electrically connected to the fourth coil pattern 340c. In detail, the pads 315c and 325c located on the top surfaces 103c and 203c are electrically connected to the pads 345c via, for example a plurality of solder balls 520c, thereby electrically connecting the first coil pattern 310c and the second coil pattern 320c to the fourth coil pattern 340c. In this way, the first coil pattern 310c is electrically connected to the second coil pattern 320c via the third coil pattern 330c and the fourth coil pattern 340c. Also, the pads 124c of the first circuit board 100c and the pads 224c of the second circuit board 200c are electrically connected to the pads 724c of the fourth circuit board 700c via, for example, a plurality of solder balls 525c. Manufacturing of a conductive coil 300c including the first coil pattern 310c, the second coil pattern 320c, the third coil pattern 330c, the fourth coil pattern 340c and the pads 315c, 325c, 335c and 345c is completed so far.

Figure 14:
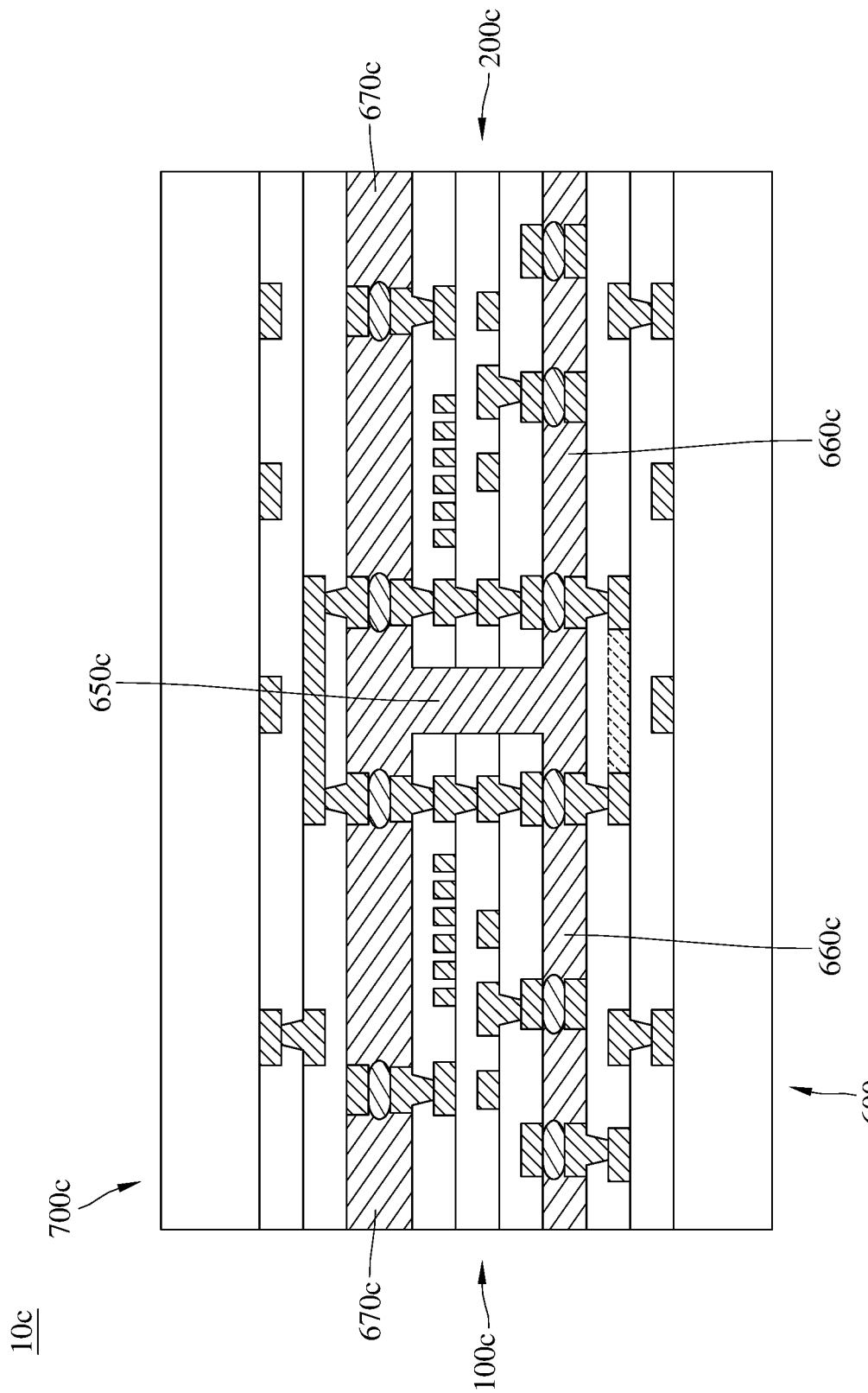

Please refer to FIG. 14, a third molding compound 670c is filled in a gap located on a side of the fourth circuit board 700c located closest to the first circuit board 100c and the second circuit board 200c. That is, the third molding compound 670c is filled in a gap located between the first circuit board 100c and the fourth circuit board 700c and a gap located between the second circuit board 200c and the fourth circuit board 700c. Manufacturing of the circuit board structure 10c is completed so far. In this embodiment, the first molding compound 650c, the second molding compound 660c and the third molding compound 670c are connected to one another.

According to the circuit board structure and the manufacture method thereof disclosed by above embodiments, the conductive coil is in a spiral shape and includes the first coil pattern disposed in the first circuit board and the second coil pattern disposed in the second circuit board. That is, the present disclosure respectively forms multiple coil patterns in multiple circuit boards to configure the conductive coil, thereby preventing the conductive coil from occupying significant amount of space in a single circuit board. Accordingly, the space utilization of each of the first circuit board and the second circuit board is improved, and the miniaturization of each of the first circuit board and the second circuit board is facilitated.

In addition, the magnetic first molding compound is filled in the gap between the first side surface and the second side surface, and the conductive coil surrounds at least a part of the first molding compound. Therefore, the first molding compound can enhance the inductance effect generated by the conductive coil without occupying the space in the first circuit board or the second circuit board. That is, the first molding compound enhances the inductance effect while improving the space utilization of each of the first circuit board and the second circuit board.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A circuit board structure, comprising:
   a first circuit board, having a first side surface, wherein a normal direction of the first side surface is perpendicular to a thickness direction of the first circuit board;
   a second circuit board, having a second side surface facing the first side surface and being spaced apart from the first side surface, wherein a normal direction of the second side surface is perpendicular to a thickness direction of the second circuit board;
   a conductive coil, in a spiral shape and comprising a first coil pattern and a second coil pattern, wherein the first coil pattern is disposed in the first circuit board, the second coil pattern is disposed in the second circuit board, and the first coil pattern is electrically connected to the second coil pattern; and
   a first molding compound, being magnetic and filled in a gap located between the first side surface and the second side surface, wherein the conductive coil surrounds at least a part of the first molding compound;
   wherein the first coil pattern is exposed to the gap from the first side surface and the second coil pattern is exposed to the gap from the second side surface.

2. The circuit board structure according to claim 1, further comprising a third circuit board, wherein the first circuit board and the second circuit board are disposed on the third circuit board.

3. The circuit board structure according to claim 2, wherein the conductive coil further comprises a third coil pattern disposed in the third circuit board, and the first coil pattern is electrically connected to the second coil pattern via the third coil pattern.

4. The circuit board structure according to claim 2, further comprising a first die and a second die, wherein the first die is disposed on the first circuit board, and the second die is disposed on the second circuit board.

5. The circuit board structure according to claim 3, further comprising a first die and a second die, wherein the first die is disposed on the first circuit board, and the second die is disposed on the second circuit board.

6. The circuit board structure according to claim 2, further comprising a second molding compound, wherein the second molding compound is filled in a gap located on a side of the third circuit board located closest to the first circuit board and the second circuit board.

7. The circuit board structure according to claim 3, further comprising a second molding compound, wherein the second molding compound is filled in a gap located on a side of the third circuit board located closest to the first circuit board and the second circuit board.

8. The circuit board structure according to claim 2, further comprising a fourth circuit board disposed on the first circuit board and the second circuit board.

9. The circuit board structure according to claim 8, wherein the conductive coil further comprises a third coil pattern and a fourth coil pattern, the third coil pattern is disposed in the third circuit board, the fourth coil pattern is disposed in the fourth circuit board, and the first coil pattern is electrically connected to the second coil pattern via the third coil pattern and the fourth coil pattern.

10. The circuit board structure according to claim 8, further comprising a second molding compound and a third molding compound, wherein the second molding compound is filled in a gap located on a side of the third circuit board located closest to the first circuit board and the second circuit board, and the third molding compound is filled in a gap located on a side of the fourth circuit board located closest to the first circuit board and the second circuit board.

11. The circuit board structure according to claim 1, wherein the second circuit board further has a cavity, the second side surface faces the cavity, and the first circuit board is located in the cavity.

12. The circuit board structure according to claim 11, further comprising a second molding compound, wherein the first circuit board further has a bottom surface, the bottom surface is located adjacent to the first side surface, the second circuit board further has a lower surface, the lower surface and the second side surface form the cavity, and the second molding compound is filled in a gap located between the bottom surface of the first circuit board and the lower surface of the second circuit board.

13. A manufacture method of a circuit board structure, comprising: forming a first coil pattern of a conductive coil in a spiral shape, in a first circuit board; forming a second coil pattern of the conductive coil in a spiral shape, in a second circuit board; electrically connecting the first coil pattern to the second coil pattern; and filling a first molding compound in a gap located between a first side surface of the first circuit board having a normal direction perpendicular to a thickness direction of the first circuit board and a second side surface of the second circuit board having a normal direction perpendicular to a thickness direction of the second circuit board, wherein the first molding compound is magnetic, and the conductive coil surrounds at least a part of the first molding compound, and wherein the first coil pattern is exposed to the gap from the first side surface and the second coil pattern is exposed to the gap from the second side surface.

14. The manufacture method of the circuit board structure according to claim 13, further comprising:
   disposing the first circuit board and the second circuit board on a third circuit board.

15. The manufacture method of the circuit board structure according to claim 14, further comprising:
   forming a third coil pattern of the conductive coil in the third circuit board;
   wherein, electrically connecting the first coil pattern to the second coil pattern comprises electrically connecting the first coil pattern to the second coil pattern via the third coil pattern.

16. The manufacture method of the circuit board structure according to claim 14, further comprising:
   disposing a fourth circuit board on the first circuit board and the second circuit board.

17. The manufacture method of the circuit board structure according to claim 16, further comprising:
   forming a third coil pattern of the conductive coil in the third circuit board; and
   forming a fourth coil pattern of the conductive coil in the fourth circuit board;
   wherein, electrically connecting the first coil pattern to the second coil pattern comprises electrically connecting the first coil pattern to the second coil pattern via the third coil pattern and the fourth coil pattern.

* * * * *